(12) United States Patent
Herbst et al.

(10) Patent No.: US 9,213,761 B1
(45) Date of Patent: Dec. 15, 2015

(54) ELECTRONIC SYSTEMS AND METHODS FOR INTEGRATED, AUTOMATIC, MEDIUM-QUALITY AUDIO

(71) Applicants: Paul M. Herbst, Austin, TX (US);
Robert T. Greenwood, Austin, TX (US);
Haku Sato, Austin, TX (US)

(72) Inventors: Paul M. Herbst, Austin, TX (US);
Robert T. Greenwood, Austin, TX (US);
Haku Sato, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 50 days.

(21) Appl. No.: 14/294,218

(22) Filed: Jun. 3, 2014

(51) Int. Cl.
*G06F 17/00* (2006.01)
*G06F 17/30* (2006.01)

(52) U.S. Cl.
CPC .................................. *G06F 17/3074* (2013.01)

(58) Field of Classification Search
CPC ....... H03M 1/822; H03M 3/506; H03M 5/08; H04L 25/4902; H03K 3/017
See application file for complete search history.

(56) References Cited

U.S. PATENT DOCUMENTS

| | | | |
|---|---|---|---|
| 6,430,220 B1 | 8/2002 | Determan | |
| 6,473,457 B1 | 10/2002 | Pascual et al. | |
| 6,606,044 B2 | 8/2003 | Roeckner et al. | |
| 7,515,072 B2 | 4/2009 | Borisavljevic | |
| 2008/0042745 A1* | 2/2008 | Kozak | H03F 1/02 330/251 |
| 2012/0275493 A1* | 11/2012 | Fortier | H03F 3/217 375/219 |

* cited by examiner

*Primary Examiner* — Andrew C Flanders

(57) ABSTRACT

A semiconductor device includes a single substrate including circuitry to implement a processor, a memory coupled to the processor, an audio interface module configured to provide data in pulse-code modulation (PCM) format having a first signal to noise ratio (SNR), and a medium quality speaker module configured to receive the PCM data, convert the data from the PCM format to a pulse-width modulation (PWM) format independently of the processor, and provide the data in the PWM format having a second SNR to at least one general purpose input-output pin on the substrate, the first SNR is greater than the second SNR.

20 Claims, 2 Drawing Sheets

ELECTRONIC SYSTEMS AND METHODS FOR INTEGRATED, AUTOMATIC, MEDIUM-QUALITY AUDIO

BACKGROUND

1. Field

This disclosure relates generally to integrated on-chip audio systems, and more specifically, to electronic systems and methods for integrated, automatic, medium-quality audio.

2. Related Art

As electronic systems scale, the competition for space within those electronic systems among the various circuits, subsystems, and/or applications increases. One function provided by some electronic systems is the ability to provide an audio output to an external device. However, the hardware required to provide such an output may be relatively large and/or expensive to implement.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
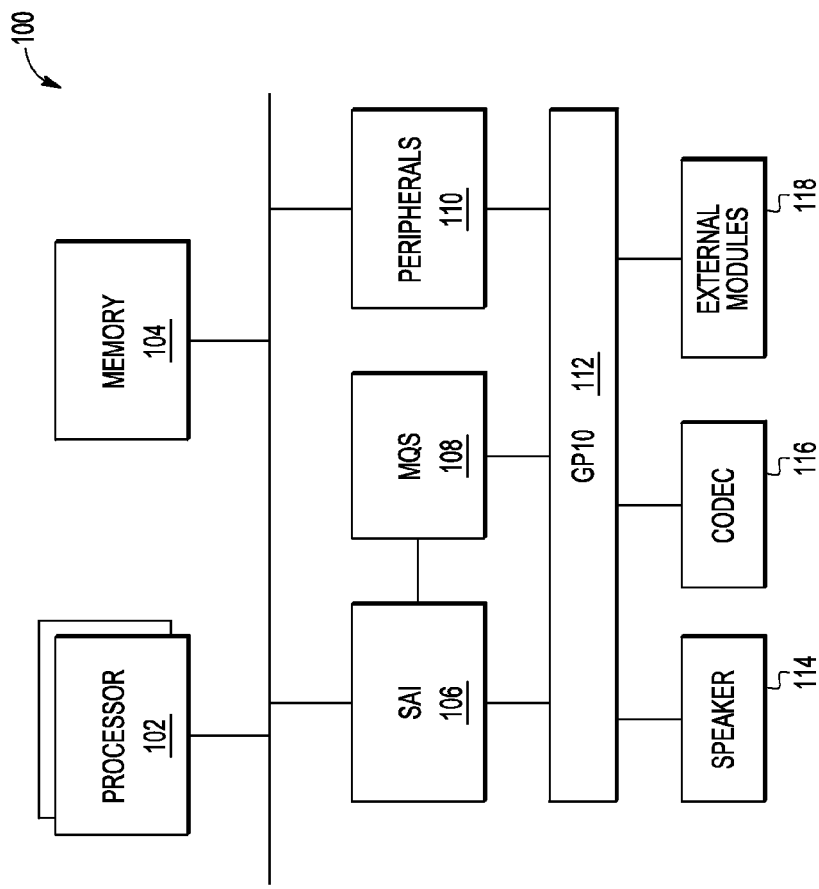
FIG. 1 illustrates an example electronic system for providing an integrated, automatic, medium-quality audio output, in accordance with certain embodiments of the present disclosure.

Generally, "high-quality" audio may refer to an audio signal with relatively high audio properties. For example, high-quality audio may have a relatively low level of total harmonic distortion ("THD") (e.g., less than 0.1%). By contrast, a "medium-quality" audio signal may be one in which a greater level of distortion is tolerated (e.g., a THD level of 2-20%). As an additional example, high-quality audio may have a relatively high signal-to-noise ratio (e.g., greater than 90 dB), while medium-quality audio may tolerate a greater noise level (e.g., a signal-to-noise ratio of 30-80 dB).

While the provision of an audio output to certain external components of an electronic system (e.g., an audio codec, a speaker, etc.) may be a necessary and/or desirable feature, it may not be necessary in certain configurations to provide a high-quality audio output. For example, it may be more beneficial to the overall system design to balance audio performance with a cost associated with the audio output implementation. For example, in order to provide 16-bit audio, an electronic system may require a relatively expensive digital-to-analog converter ("DAC") within the system and/or to implement a relatively expensive audio codec external to a portion of the system prior to making the output available for us. However, some configurations may not need to make use of higher quality audio, but may need to make use of lower quality audio. In such a configuration, a simple, integrated, automatic code may be all that is required. For example, a configuration may need to make use of a smaller range of frequencies, a less demanding fidelity level, and/or fewer features in controlling the audio signal (e.g., a "medium-quality audio" signal).

An electronic system may provide a medium-quality audio output by, for example, implementing a conversion of an extant higher-quality signal into a format that may drive an external audio component (e.g., a speaker) without the use of intermediaries, including codecs, DACs, and/or software. Such a process may be integrated into the electronic system (e.g., in a system-on-chip) and may automatically provide the audio output via the same types of interface pins used by the electronic system for other functions. Such a configuration may provide a medium-quality audio output that may be, as an illustration, higher quality than a cassette tape-based audio but of a lower quality than a compact disc-based audio.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

FIG. 1 illustrates an example electronic system 100 for providing an integrated, automatic, medium-quality audio output, in accordance with certain embodiments of the present disclosure. System 100 may be any electronic system for which it may be desirable to use a medium-quality rather than a high-quality audio output. For example, many electronic systems may be configured with an overall design goal of reduced cost rather than improved performance. As an additional example, electronic systems implemented in certain environments may only wish to make use of certain discreet portions of the audible spectrum (e.g., beeps, alarms, etc.). Further, in some embodiments system 100 may be implemented on one or more substrates.

In some embodiments, electronic system 100 may include processor 102, memory 104, serial audio interface ("SAI") 106, medium quality speaker ("MQS") module 108, and/or peripherals 110 communicatively coupled to one another via one or more bus(es) within electronic system 100. SAI 106, MQS module 108, and/or peripherals 110 may be further coupled to one or more external interface pins 112.

In some embodiments, processor 102 may be any appropriate processing device including a microprocessor and/or microcontroller and/or one or more cores associated with a microprocessor and/or microcontroller. Although FIG. 1 illustrates two processors 102, any number of processors 102 may be included for a given configuration of electronic system 100 without departing from the scope of the present disclosure. Memory 104 may be any component or components operable to store data for the use of electronic system 100. For example, memory 104 may include volatile and/or non-volatile memory structures.

In some embodiments, electronic system 100 may also include SAI 106. SAI 106 may be any appropriate component and/or combination of components operable to provide a serialized, digital high-quality audio signal. For example, SAI 106 may be a synchronous serial interface ("SSI"), serial audio interface ("SAI"), extended serial audio interface ("ESAI"), and/or any other appropriate serial interface.

In some embodiments, SAI 106 may be operable to provide a pulse code modulated ("PCM") high-quality audio signal. In some configurations, SAI 106 may provide a 16-bit audio signal sampled at a standard 44.1 and/or 48 kHz. SAI 106 may be communicatively coupled to MQS module 108. MQS module 108 may be an appropriate component or collection of components operable convert the high-quality audio signal to a medium-quality audio signal and provide the medium-quality audio signal to external interface pins 112, as described in more detail below with reference to FIG. 2. For example, MQS module 108 may be operable to convert a PCM signal from SAI 106 to a pulse width modulated ("PWM") signal for outputting a medium-quality audio signal.

In some embodiments, system 100 may also include one or more peripheral(s) 110 communicatively coupled to processor 102 and memory 104. Peripherals 110 may be any component or collection of components operable to provide various outputs to external interface pins 112 in order to provide various functions to other devices and/or components, as described in more detail below.

In some embodiments, external interface pins 112 may include general purpose input/output ("GPIO") pins, which may be external interface pins configured to provide digital output signals to external devices. External interface pins 112 may be operable to provide a plurality of functions over the same interface pin. For example, external interface pins 112 may be operable to provide digital output signals to speaker 114, audio codec 116, and/or other external modules 118. Depending on the configuration of electronic system 100, different external modules may make use of the GPIO pins in order to take advantage of different features.

In some embodiments, speaker 114 may be a speaker communicatively coupled to external interface pins 112 in order to output an audio signal such that the audio may be audible. Speaker 114 may be directly coupled to one or more external interface pins 112 and/or may be coupled to one or more external interface pins 112 via one or more other electrical and/or electronic components. For example, speaker 114 may include: a speaker driven directly from one or more external interface pins 112, a capacitance coupled between a speaker and one or more external interface pins 112, external circuitry coupled between a speaker and one or more external interface pins 112 (e.g., buffer and/or amplification circuitry). Further, speaker 114 may include any appropriate speaker, including a piezoelectric, magnetic cone, and/or transducer speakers.

In some embodiments, audio codec 116 may be any device operable to encode and/or decode a digital audio signal in order to provide an improved audio signal. For example, audio codec 116 may be used in order to provide a high quality audio signal.

In some embodiments, external modules 118 may be any appropriate device, circuit, interface, system, or other collection of components operable to receive a digital signal via one or more external interface pins 112. For example, external modules 118 may be a universal asynchronous receiver/transmitter ("UART") interface, a memory module, a processor, an interface device, a communication interface (e.g., Ethernet), another system, another bus, etc.

In operation, SAI 106 may provide a serialized, high-quality audio signal to MQS 108. As described in more detail below with reference to FIG. 2, MQS 108 may convert the high-quality audio signal to a medium-quality audio signal for output to external interface pins 112. MQS 108 may provide the conversion without direction or interruption from processor 102. That is, MQS 108 may operate in an automatic, hardware-driven manner without taking up processor resources. Thus, in some configurations, MQS 108 may provide the conversion at a lower power than may occur by performing the conversion using processor resources.

As a result of the conversion process, MQS 108 may provide the medium-quality audio signal to one or more external interface pins 112, as described in more detail below with reference to FIG. 2. In some embodiments, then, both the high-quality and medium-quality audio signals may be provided to external interface pins 112. This may allow for a variety of configurations of system 100 in order to take advantage of the plurality of audio output options. For example, should a configuration of system 100 make use of the high-quality audio output, a system designer may add an additional codec (either internal or external to system 100). However, should the configuration not make use of the high-quality audio output, the additional codec may not be necessary. For example, if a system requires a higher quality audio signal (e.g., one with greater than a 90 dB signal-to-noise ratio), the codec may be added, but for a system without such a requirement, the codec may be left out. Further, should the configuration make use of the medium-quality audio output, a system designer may take the medium-quality audio output directly from external interface pins 112 without use of additional components. However, should the configurations not make use of the medium-quality audio output, external interface pins 112 may be used for other functions.

With the presence of the medium-quality audio output, system 100 may allow for a variety of configurations without the use of special types of pins dedicated to the use of audio outputs. For example, in systems with a dedicated DAC, the system may require dedicated audio output pins. In the event that a given configuration of the system does not make use of the audio output, these pins may not be able to be reused for other functions.

Figure 2:
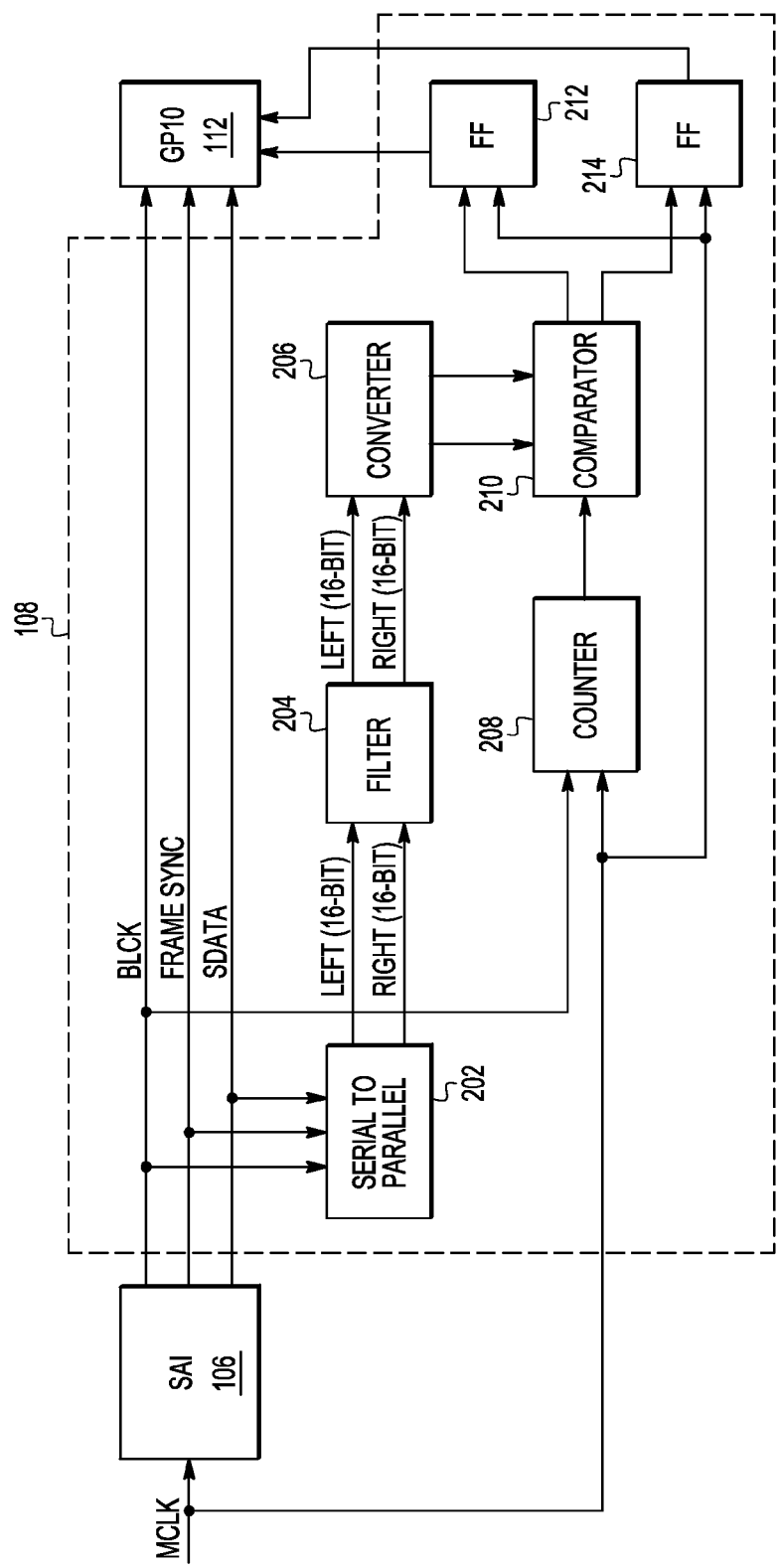
FIG. 2 illustrates an example implementation of a medium quality speaker ("MQS"), in accordance with certain embodiments of the present disclosure.

FIG. 2 illustrates an example implementation of MQS 108, in accordance with certain embodiments of the present disclosure. MQS 108 may be communicatively coupled to SAI 106 and external interface pins 112, as described in more detail above with reference to FIG. 1.

In some embodiments, MQS module 108 may include serial to parallel converter 202 communicatively coupled to filter 204, which may then be communicatively coupled to converter 206. Converter 206 may be communicatively coupled to comparator 210, which may also be communicatively coupled to counter 208 and one or more latch components 212, 214.

In some embodiments, SAI 106 may provide a high-quality audio signal to external interface pins 112. In order to aid in understanding and description, three lines are shown, labeled as the bit clock line ("BCLK"), frame sync line ("FrameSync"), and serial data line ("SData"). In the illustrated example, three of the external interface pins 112 may be used to accommodate the high-quality audio signal when this function is needed for a given configuration. In other configurations, more, fewer, or different lines and/or pins may be used without departing from the scope of the different disclosure.

In some embodiments, these signals may be tapped by certain components of MQS module 108. For example, all signals may be used by serial to parallel converter 202 in order to convert the serial data provided by SAI 106 into a parallel data signal. In some embodiments, this may be done in order to separate the stereo channels into different signals. These signals may then be communicated to filter 204.

In some embodiments, filter 204 may be any components and/or collection of components operable to convert the incoming signals from a first information level to a second information level, where the second information level is lower than the first, and to reduce a noise level associated with the reduction in information level. For example, filter 204 may be a sigma-delta filter operable to reduce the number of bits associated with the audio signal from sixteen to six. In the same or alternative configurations, a reduction in information level may be done separately from a filtering operation.

In some embodiments, the reduction in information level may be associated with a conversion from one type of audio signal to another type of audio signal. For example, filter 204 may be operable to begin the process to convert the incoming PCM audio data to PWM data. Filter 204 may begin the process by oversampling the PCM audio data. In the same or alternative embodiments, filter 204 may then convert the incoming two's complement PCM audio data to signed magnitude data. This data may be associated with a pulse width value of the converted data.

In some embodiments, filter 204 may be further operable to reduce an information level associated with the converted data. For example, filter 204 may be operable to reduce the number of bits associated with the audio data from sixteen to six. In accordance with reducing the information level, filter 204 may also be operable to reduce an overall noise level associated with the reduction in information level. For example, filter 204 may be operable to implement a sigma-delta filter in order to alter a noise level associated with a desired frequency range (e.g., audible frequency range).

In some embodiments, the resultant data may be then be communicated to converter 206. Converter 206 may be operable to further process the incoming data. For example, converter 206 may be operable to convert signed magnitude data to unsigned magnitude data. Converter 206 may then communicate the pulse width value data to comparator 210. Converter 206 may convert the signed magnitude data to unsigned magnitude data by performing an exclusive OR ("XOR") operation on the incoming PCM audio data. In some configurations, this may include performing a full XOR operation on the incoming PCM audio data and a corresponding bit value with a logical HIGH value at the most significant bit. In the same or alternative configurations, this may include only inverting the most significant bit of the incoming PCM audio data.

In some embodiments, the data communicated among filter 204, converter 206, and/or comparator 210 may be communicated over one or more communication paths. In configurations including more than one communication paths, each communication path may be associated with a separate audio channel. Depending on the configuration chosen, one or more frame sync signals may be used to interleave and/or deinterleave the audio data.

Comparator 210 may be any appropriate components and/or collection of components operable to compare a counter value received from counter 208 with the pulse width value data received from converter 206. Accordingly, counter 208 may be any appropriate components and/or collection of components operable to provide a counter value to comparator 210. The counter value may be operable to provide an electrical signal associated with increments between a first value and a second value, wherein the first and second values define the overall width of the desired PWM window. For example, the PWM window may be defined in part by a number of bits associated with counter 208 (e.g., 16 bits), wherein counter 208 provides a counter value cycling through a range of values provided by the number of bits (e.g., 0-15).

The overall width of the window may be driven by the number of counts between the first value and the second value (i.e., the overall width of the window will be the full counter length), as well as a clock value that may determine the width of the increments between the first and second value.

Comparator 210 may be operable to compare the counter value to the pulse width value in order to generate a PWM output signal. In some embodiments, comparator 210 may generate the PWM output signal by comparing the pulse width value to each increment of the counter value until comparator 210 determines that the values are equivalent, at which point the output of comparator 210 may switch from a logical HIGH value to a logical LOW value through the end of the desired PWM window, at which point the process may begin again. Comparators 210 may be further operable to then output the PWM output signal to one or more latch devices 212, 214.

In some embodiments, latch devices 212, 214 may be operable to hold a value output from comparator 210 for a certain time in order to smooth the PWM output signal prior to communicating the signal to external interface pins 112. For example, latch devices 212, 214 may be flip-flops operable to receive the PWM output signal from comparator 210 and a master clock signal. Latch devices 212, 214 may then sample the PWM output signal at a certain time interval associated with the master clock signal such that noise introduced by comparator 210 may be reduced and/or eliminated. Latch devices 212, 214 may then be operable to output the audio signal to one or more external interface pins 112.

In some configurations of MQS module 108, there may be one latch device for each audio channel associated with the PWM output signal. Thus, two latch devices 212, 214 are depicted in the illustrated example of FIG. 2. However, more, fewer, or different latch devices may be implemented for a given configuration of MQS module 108 without departing from the scope of the present disclosure.

In operation, serial to parallel converter 202, filter 204, converter 206, counter 208, comparator 210, and latch devices 212, 214 may work together to convert a high-quality audio signal to a medium-quality audio signal in a digital format to the same type of external interface pins 112 to which the high-quality audio signal was provided. The conversion is performed in an automatic manner without intervention or control from processor 102.

In some embodiments, the conversion provided by MQS module 108 may be automatically performed without regard to a sampling frequency of the high-quality audio signal provided by SAI 106. For example, although SAI 106 may provide an audio signal sampled at either 44.1 or 48 kHz, MQS module 108 may perform the conversion to a medium-quality audio signal with the same or substantially similar performance characteristics regardless of the sampling frequency of the high-quality.

By now it should be appreciated that there has been provided structures and methods for providing integrated, automatic, medium-quality audio. Such structures and methods may be implemented without intervention or direction from a processor, without requiring specialized interface pins, and/or without regard to sampling frequency. Further, such structures and methods may be implemented without relatively expensive and/or large secondary devices such as codecs or DACs.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, more, fewer, or different audio channels may be implemented without departing from the scope of the present disclosure. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Electronic systems and methods for integrated, automatic, medium-quality audio are disclosed. This may include a semiconductor device including a single substrate including circuitry to implement: a processor, a memory (104) coupled to the processor, an audio interface module (106) configured to provide data in pulse-code modulation (PCM) format having a first signal to noise ratio (SNR), and a medium quality speaker (MQS) module (108) configured to receive the PCM data, convert the data from the PCM format to a pulse-width modulation (PWM) format independently of the processor, and provide the data in the PWM format having a second SNR to at least one general purpose input-output (GPI/O) pin on the substrate, the first SNR is greater than the second SNR.

In some embodiments, the data in the PCM format may include a first number of bits and the data in the PWM format may include less than the first number of bits. In the same or alternative embodiments, the first SNR may be greater than or equal to approximately 90 decibels and the second SNR may be less than approximately 70 decibels.

In some embodiments, the MQS module may include a converter (206) that may include XOR logic to convert two's complement data in the PCM format to unsigned magnitude data in the PWM format. The semiconductor device may also include a counter (208) configured to receive a frame sync signal from the data in the PCM format and a clock signal, and output a counter signal, and a comparator (210) configured to receive the counter signal, a first PWM signal representing a first pulse width of a first channel of the data, and a second PWM signal representing a second pulse width of a second channel of the data, and generate a first PWM output for the first channel and a second PWM output for the second channel, wherein the first and second PWM outputs may be in a first state when the counter signal is less than respective ones of the first and second PWM signals and the first PWM outputs may be in a second state when the counter signal is greater than or equal to the respective ones of the first and second PWM signals. The semiconductor device may further include a first flip-flop circuit configured to receive the first PWM output of the comparator, and a second flip-flop circuit configured to receive the second PWM output of the comparator, the first and second flip-flop circuits are coupled to respective first and second GPIO pins.

In some embodiments, the MQS module may include a serial to parallel converter (202) configured to convert the PCM data from serial to parallel format. The MQS module may also include a filter (204) configured to receive the PCM data in parallel format, oversample the PCM data, reduce noise in the PCM data, and reduce the number of bits in the PCM data to generate filtered PCM data. In the same or alternative embodiments, the MQS module may operate independently of sampling frequency of the data in the PCM and PWM formats.

The semiconductor device may also include at least one of a group consisting of: a digital to analog converter implemented on the substrate and coupled to receive the data in the PCM format and to output the data as an analog signal, and an audio encoder/decoder (116) implemented as circuitry on a second substrate coupled to receive the data in the PCM format and to output the data as at least one of a digital and an analog signal.

A semiconductor device is also disclosed that may include a processor (102), an audio interface module (106) coupled to provide data in pulse-code modulation (PCM) format, a medium quality speaker (MQS) module (108) configured to receive the PCM data, convert the PCM data to a pulse-width modulation (PWM) format independently of the processor, and provide the data in PWM format to a general purpose input/output (I/O) pin (112) on the substrate. The MQS module may include a serial to parallel converter (202) configured to convert the PCM data from serial to parallel format, a filter (204) configured to oversample and remove noise from the PCM data in parallel format to generate filtered PCM data in two's complement format, wherein the filtered PCM data includes fewer bits than the PCM data in the parallel format, and a converter (206) that may use one of a group consisting of: XOR logic and most significant bit (MSB) inversion logic to convert the filtered PCM data to unsigned magnitude data in the PWM format.

In some embodiments, the semiconductor device may be configured such that the data in PCM format has a first signal to noise ratio (SNR), and the data from the PWM format has a second SNR, the first SNR is greater than the second SNR. In the same or alternative embodiments, the data in the PCM format may include a first number of bits and the data in the PWM format may include less than the first number of bits. In some configurations, the first SNR may be greater than or equal to approximately 90 decibels and the second SNR may be less than approximately 70 decibels.

In some embodiments, the semiconductor device may be configured such that the MQS module may operate independently of sampling frequency of the data in the PCM and PWM formats.

In some embodiments, the semiconductor device may also include at least one of a group consisting of: a digital to analog converter implemented on the substrate and coupled to receive the data in the PCM format and to output the data as an analog signal, and an audio encoder/decoder (116) implemented as circuitry on a second substrate coupled to receive the data in the PCM format and to output the data as at least one of a digital and an analog signal.

In the same or alternative embodiments, the semiconductor device may also include a counter (208) configured to receive a frame sync signal from the data in the PCM format and a clock signal, and output a counter signal, and a comparator (210) configured to receive the counter signal, a first PWM signal may represent a first pulse width of a first channel of the data, and a second PWM signal may represent a second pulse width of a second channel of the data, and may generate a first PWM output for the first channel and a second PWM output for the second channel, wherein the first and second PWM outputs may be in a first state when the counter signal is less than respective ones of the first and second PWM signals and the first PWM outputs may be in a second state when the counter signal is greater than or equal to the respective ones of the first and second PWM signals. In some configurations, the semiconductor device may also include a first flip-flop circuit (212) configured to receive the first PWM output of the comparator; and a second flip-flop circuit (214) configured to receive the second PWM output of the comparator, wherein the first and second flip-flop circuits may be coupled to respective first and second GPIO pins.

A method of converting data from pulse-coded modulation (PCM) format to pulse-width modulation format is also disclosed. The method may include oversampling and removing noise (204) from the data in a first PCM format to generate filtered PCM data in two's complement format, wherein the filtered PCM data includes fewer bits than the data in the first PCM format, converting the filtered PCM data (206) to unsigned magnitude data in a PWM format using one of a group consisting of: XOR logic and most significant bit (MSB) inversion logic, and comparing the unsigned magnitude data (210) to a counter value to determine when an output of the comparator changes state, latching the output of the comparator (212, 214) for each of a plurality of clock cycles and providing latched comparator signals to a general purpose input/output pin of a semiconductor device, wherein the oversampling, converting, comparing and latching are performed by circuitry implemented on a single substrate, and a signal-to-noise ratio (SNR) of the data in the first PCM format is greater than or equal to approximately 90 decibels and a SNR of the latched comparator signals is less than approximately 70 decibels.

In some embodiments, the method may be implemented such that the oversampling, converting, comparing and latching are performed independently of sampling frequency of the data in the first PCM format and the unsigned magnitude data in the PWM format.

What is claimed is:

1. A semiconductor device comprising:
a single substrate including circuitry to implement:
a processor;
a memory coupled to the processor;
an audio interface module configured to provide data in pulse-code modulation (PCM) format having a first signal to noise ratio (SNR); and
a medium quality speaker (MQS) module configured to receive the PCM data, convert the data from the PCM format to a pulse-width modulation (PWM) format independently of the processor, and provide the data in the PWM format having a second SNR to at least one general purpose input-output (GPI/O) pin on the substrate, the first SNR is greater than the second SNR.

2. The semiconductor device of claim 1 wherein the data in the PCM format includes a first number of bits and the data in the PWM format includes less than the first number of bits.

3. The semiconductor device of claim 1, wherein the first SNR is greater than or equal to approximately 90 decibels and the second SNR is less than approximately 70 decibels.

4. The semiconductor device of claim 1 wherein the MQS module includes
a converter that includes XOR logic to convert two's complement data in the PCM format to unsigned magnitude data in the PWM format.

5. The semiconductor device of claim 1 wherein the MQS module includes
a serial to parallel converter configured to convert the PCM data from serial to parallel format.

6. The semiconductor device of claim 5 wherein the MQS module includes
a filter configured to receive the PCM data in parallel format, oversample the PCM data, reduce noise in the PCM data, and reduce the number of bits in the PCM data to generate filtered PCM data.

7. The semiconductor device of claim 1 wherein the MQS module operates independently of sampling frequency of the data in the PCM and PWM formats.

8. The semiconductor device of claim 1 further comprising:
at least one of a group consisting of:
a digital to analog converter implemented on the substrate and coupled to receive the data in the PCM format and to output the data as an analog signal, and
an audio encoder/decoder implemented as circuitry on a second substrate coupled to receive the data in the PCM format and to output the data as at least one of a digital and an analog signal.

9. The semiconductor device of claim 4 further comprising:
a counter configured to receive a frame sync signal from the data in the PCM format and a clock signal, and output a counter signal; and
a comparator configured to receive the counter signal, a first PWM signal representing a first pulse width of a first channel of the data, and a second PWM signal representing a second pulse width of a second channel of the data, and generate a first PWM output for the first channel and a second PWM output for the second channel, wherein the first and second PWM outputs are a first state when the counter signal is less than respective ones of the first and second PWM signals and the first PWM outputs are a second state when the counter signal is greater than or equal to the respective ones of the first and second PWM signals.

10. The semiconductor device of claim 9 further comprising:
a first flip-flop circuit configured to receive the first PWM output of the comparator; and
a second flip-flop circuit configured to receive the second PWM output of the comparator, the first and second flip-flop circuits are coupled to respective first and second GPIO pins.

11. A semiconductor device comprising:
a processor;
an audio interface module coupled to provide data in pulse-code modulation (PCM) format;
a medium quality speaker (MQS) module configured to receive the PCM data, convert the PCM data to a pulse-width modulation (PWM) format independently of the processor, and provide the data in PWM format to a general purpose input/output (I/O) pin on the substrate, the MQS module including:
a serial to parallel converter configured to convert the PCM data from serial to parallel format;
a filter configured to oversample and remove noise from the PCM data in parallel format to generate filtered PCM data in two's complement format, wherein the filtered PCM data includes fewer bits than the PCM data in the parallel format; and
a converter that uses one of a group consisting of: XOR logic and most significant bit (MSB) inversion logic, to convert the filtered PCM data to unsigned magnitude data in the PWM format.

12. The semiconductor device of claim 11 wherein
the data in PCM format has a first signal to noise ratio (SNR); and
the data from the PWM format has a second SNR, the first SNR is greater than the second SNR.

13. The semiconductor device of claim 11 wherein
the data in the PCM format includes a first number of bits and the data in the PWM format includes less than the first number of bits.

14. The semiconductor device of claim 12 wherein
the first SNR is greater than or equal to approximately 90 decibels and the second SNR is less than approximately 70 decibels.

15. The semiconductor device of claim 11 wherein
the MQS module operates independently of sampling frequency of the data in the PCM and PWM formats.

16. The semiconductor device of claim 11 further comprising:
at least one of a group consisting of:
a digital to analog converter implemented on the substrate and coupled to receive the data in the PCM format and to output the data as an analog signal, and
an audio encoder/decoder implemented as circuitry on a second substrate coupled to receive the data in the PCM format and to output the data as at least one of a digital and an analog signal.

17. The semiconductor device of claim 11 further comprising:
a counter configured to receive a frame sync signal from the data in the PCM format and a clock signal, and output a counter signal; and
a comparator configured to receive the counter signal, a first PWM signal representing a first pulse width of a first channel of the data, and a second PWM signal representing a second pulse width of a second channel of the data, and generate a first PWM output for the first channel and a second PWM output for the second channel, wherein the first and second PWM outputs are a first state when the counter signal is less than respective ones of the first and second PWM signals and the first PWM outputs are a second state when the counter signal is greater than or equal to the respective ones of the first and second PWM signals.

18. The semiconductor device of claim 17 further comprising:
a first flip-flop circuit configured to receive the first PWM output of the comparator; and
a second flip-flop circuit configured to receive the second PWM output of the comparator, the first and second flip-flop circuits are coupled to respective first and second GPIO pins.

19. A method of converting data from pulse-coded modulation (PCM) format to pulse-width modulation format comprising:
oversampling and removing noise from the data in a first PCM format to generate filtered PCM data in two's complement format, wherein the filtered PCM data includes fewer bits than the data in the first PCM format;
converting the filtered PCM data to unsigned magnitude data in a PWM format using one of a group consisting of: XOR logic and most significant bit (MSB) inversion logic; and
comparing the unsigned magnitude data to a counter value to determine when an output of the comparator changes state
latching the output of the comparator for each of a plurality of clock cycles and providing latched comparator signals to a general purpose input/output pin of a semiconductor device, wherein the oversampling, converting, comparing and latching are performed by circuitry implemented on a single substrate, and a signal-to-noise ratio (SNR) of the data in the first PCM format is greater than or equal to approximately 90 decibels and a SNR of the latched comparator signals is less than approximately 70 decibels.

20. The method of claim 19 further comprising:
the oversampling, converting, comparing and latching are performed independently of sampling frequency of the data in the first PCM format and the unsigned magnitude data in the PWM format.

\* \* \* \* \*